(12) United States Patent
Lee et al.

(10) Patent No.: US 7,934,074 B2
(45) Date of Patent: Apr. 26, 2011

(54) FLASH MODULE WITH PLANE-INTERLEAVED SEQUENTIAL WRITES TO RESTRICTED-WRITE FLASH CHIPS

(75) Inventors: Charles C. Lee, Cupertino, CA (US);
Frank Yu, Palo Alto, CA (US);
Ming-Shiang Shen, Taipei Hsien (TW);
Abraham C. Ma, Fremont, CA (US);
David Q. Chow, San Jose, CA (US)

(73) Assignee: Super Talent Electronics, San Jose, CA (US)

( * ) Notice: Subject to any disclaimer, the term of this patent is extended or adjusted under 35 U.S.C. 154(b) by 786 days.

(21) Appl. No.: 11/871,011

(22) Filed: Oct. 11, 2007

(65) Prior Publication Data
US 2008/0034153 A1    Feb. 7, 2008

Related U.S. Application Data

(63) Continuation-in-part of application No. 11/624,667, filed on Jan. 18, 2007, now abandoned, and a continuation-in-part of application No. 11/466,759, filed on Aug. 23, 2006, now Pat. No. 7,702,831, and a continuation-in-part of application No. 10/789,333, filed on Feb. 26, 2004, now Pat. No. 7,318,117.

(51) Int. Cl.
*G06F 12/06*    (2006.01)

(52) U.S. Cl. ...................................... 711/217; 711/103
(58) Field of Classification Search .............. 711/5, 103, 711/127, 157, 170, 200, 202, 217–219
See application file for complete search history.

(56) References Cited

U.S. PATENT DOCUMENTS
| | | | |
|---|---|---|---|
| 6,725,321 B1 * | 4/2004 | Sinclair et al. | ................. 711/103 |
| 2002/0194451 A1 * | 12/2002 | Mukaida et al. | ............... 711/203 |

* cited by examiner

*Primary Examiner* — Jared I Rutz
(74) *Attorney, Agent, or Firm* — Stuart T. Auvinen; gPatent LLC

(57) ABSTRACT

A flash memory controller on a PCIE bus controls flash-memory modules on a flash bus. The flash-memory modules are plane-interleaved using interleaved bits extracted from the lowest bits of the logical block index. These plane-interleave bits are split into a LSB and a MSB, with middle physical block bits between the LSB and MSB. A physical sequential address counter generates a physical block number by incrementing the plane-interleave bits before the middle physical block bits, and then relocating the MSB to above the middle physical block bits. This causes blocks to be accessed in a low-high sequence of 0, 1, 4096, 4097, 2, 3, 4098, 4099, etc. in the four planes of flash memory. A RAM physical page valid table tracks valid pages in the four planes, while a RAM mapping table stores the plane, block, and page addresses for logical sectors generated by the physical sequential address counter.

15 Claims, 14 Drawing Sheets

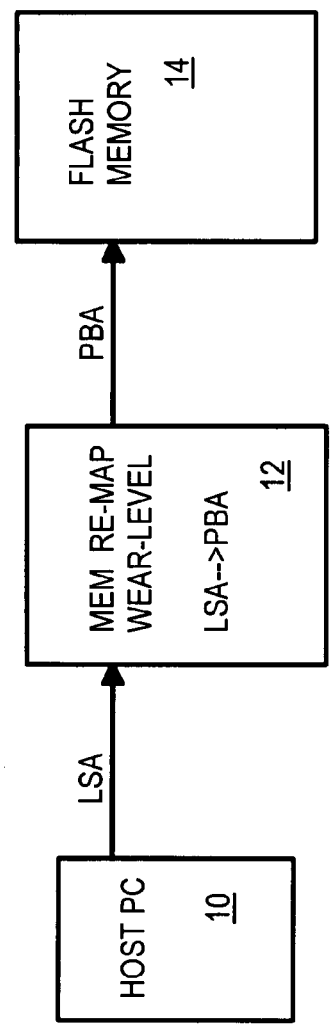

FRONT SIDE

FIG. 11A (LBI, LSI, LEN)

(0,1,9)   (0,1)
          (0,2)
          (0,3)   BLK 0, PAGE 0
            ⋮     SECTORS 1:7

(0,7)
          (1,0)   BLK 1, PAGE 0
          (1,1)   SECTORS 0:1

PHYSICAL SEQUENTIAL ADDRESS COUNTER (PSAC)

| CHIP | PLANE ↓ BLK | PAGE ↓ |
|---|---|---|
| 0 | 0   0 | 0 |

↓

| 0 | 1   1 | 0 |

PLANE 0

| | | | | | | | |
|---|---|---|---|---|---|---|---|
| PAGE 0 | (0,7) | (0,6) | (0,5) | (0,4) | (0,3) | (0,2) | (0,1) | 0 |
| PAGE 1 | 0 | 0 | 0 | 0 | 0 | 0 | 0 | 0 |

BLK 0

PLANE 1

| | | | | | | | |
|---|---|---|---|---|---|---|---|
| PAGE 0 | 0 | 0 | 0 | 0 | 0 | 0 | (1,1) | (1,0) |
| PAGE 1 | 0 | 0 | 0 | 0 | 0 | 0 | 0 | 0 |

BLK 1

PLANE 2

| | | | | | | | |
|---|---|---|---|---|---|---|---|
| PAGE 0 | 0 | 0 | 0 | 0 | 0 | 0 | 0 | 0 |
| PAGE 1 | 0 | 0 | 0 | 0 | 0 | 0 | 0 | 0 |

PLANE 3

| | | | | | | | |
|---|---|---|---|---|---|---|---|
| PAGE 0 | 0 | 0 | 0 | 0 | 0 | 0 | 0 | 0 |
| PAGE 1 | 0 | 0 | 0 | 0 | 0 | 0 | 0 | 0 |

FIG. 11B (LBI, LSI, LEN)

(1,3,1)

(1,3)   BLK 4096, PAGE 0
        SECTOR 3

PHYSICAL SEQUENTIAL
ADDRESS COUNTER
(PSAC)

CHIP ↓ PLANE ↓ BLK ↓ PAGE ↓

0   1   1   0

↓

0   2   4096   0

PLANE 0

| PAGE 0 | (0,7) | (0,6) | (0,5) | (0,4) | (0,3) | (0,2) | (0,1) | 0 | BLK 0 |
| PAGE 1 | 0 | 0 | 0 | 0 | 0 | 0 | 0 | 0 |

PLANE 1

| PAGE 0 | 0 | 0 | 0 | 0 | 0 | 0 | (1,1) | (1,0) | BLK 1 |
| PAGE 1 | 0 | 0 | 0 | 0 | 0 | 0 | 0 | 0 |

PLANE 2

| PAGE 0 | 0 | 0 | 0 | 0 | (1,3) | 0 | 0 | 0 | BLK 4096 |
| PAGE 1 | 0 | 0 | 0 | 0 | 0 | 0 | 0 | 0 |

PLANE 3

| PAGE 0 | 0 | 0 | 0 | 0 | 0 | 0 | 0 | 0 |
| PAGE 1 | 0 | 0 | 0 | 0 | 0 | 0 | 0 | 0 |

FIG. 11C (LBI, LSI, LEN)

(2,4,2)

(2,4)  BLK 4097, PAGE 0
(2,5)  SECTORS 4,5

PHYSICAL SEQUENTIAL
ADDRESS COUNTER
(PSAC)

```
           PLANE   PAGE
     CHIP ↓  BLK ↓
      0    2  4096  0
             ↓
      0    3  4097  0
```

PLANE 0

| | | | | | | | | |
|---|---|---|---|---|---|---|---|---|
| PAGE 0 | (0,7) | (0,6) | (0,5) | (0,4) | (0,3) | (0,2) | (0,1) | 0 | BLK 0
| PAGE 1 | 0 | 0 | 0 | 0 | 0 | 0 | 0 | 0 |

PLANE 1

| | | | | | | | | |
|---|---|---|---|---|---|---|---|---|
| PAGE 0 | 0 | 0 | 0 | 0 | 0 | 0 | (1,1) | (1,0) | BLK 1
| PAGE 1 | 0 | 0 | 0 | 0 | 0 | 0 | 0 | 0 |

PLANE 2

| | | | | | | | | |
|---|---|---|---|---|---|---|---|---|
| PAGE 0 | 0 | 0 | 0 | 0 | (1,3) | 0 | 0 | 0 | BLK 4096
| PAGE 1 | 0 | 0 | 0 | 0 | 0 | 0 | 0 | 0 |

PLANE 3

| | | | | | | | | |
|---|---|---|---|---|---|---|---|---|
| PAGE 0 | 0 | 0 | (2,5) | (2,4) | 0 | 0 | 0 | 0 | BLK 4097
| PAGE 1 | 0 | 0 | 0 | 0 | 0 | 0 | 0 | 0 |

FIG. 11D (LBI, LSI, LEN)

(0,0,3)

(0,0)   BLK 0, PAGE 1
(0,1)N  SECTORS 2:0
(0,2)N

PHYSICAL SEQUENTIAL
ADDRESS COUNTER
(PSAC)

|  CHIP ↓ | PLANE BLK | PAGE ↓ | |
|---|---|---|---|
| 0 | 3 | 4097 | 0 |

↓

| 0 | 0 | 0 | 1 |

PLANE 0

| | | | | | | | | |
|---|---|---|---|---|---|---|---|---|
| PAGE 0 | (0,7) | (0,6) | (0,5) | (0,4) | (0,3) | (0,2) | (0,1) | 0 | BLK 0
| PAGE 1 | (0,7) | (0,6) | (0,5) | (0,4) | (0,3) | (0,2)N | (0,1)N | (0,0) |

PLANE 1

| | | | | | | | | |
|---|---|---|---|---|---|---|---|---|
| PAGE 0 | 0 | 0 | 0 | 0 | 0 | 0 | (1,1) | (1,0) | BLK 1
| PAGE 1 | 0 | 0 | 0 | 0 | 0 | 0 | 0 | 0 |

PLANE 2

| | | | | | | | | |
|---|---|---|---|---|---|---|---|---|
| PAGE 0 | 0 | 0 | 0 | 0 | (1,3) | 0 | 0 | 0 | BLK 4096
| PAGE 1 | 0 | 0 | 0 | 0 | 0 | 0 | 0 | 0 |

PLANE 3

| | | | | | | | | |
|---|---|---|---|---|---|---|---|---|
| PAGE 0 | 0 | 0 | (2,5) | (2,4) | 0 | 0 | 0 | 0 | BLK 4097
| PAGE 1 | 0 | 0 | 0 | 0 | 0 | 0 | 0 | 0 |

FIG. 11E (LBI, LSI, LEN)

(1,4,2)

(1,4)   BLK 1, PAGE 1
        (1,5)   SECTORS 4,5

PHYSICAL SEQUENTIAL
ADDRESS COUNTER
(PSAC)

```
        PLANE  PAGE
  CHIP ↓ BLK ↓
   0   0   0   1
           ↓
   0   1   1   1
```

PLANE 0

| | | | | | | | | |
|---|---|---|---|---|---|---|---|---|
| PAGE 0 | (0,7) | (0,6) | (0,5) | (0,4) | (0,3) | (0,2) | (0,1) | 0 | BLK 0
| PAGE 1 | (0,7) | (0,6) | (0,5) | (0,4) | (0,3) | (0,2)N | (0,1)N | (0,0) |

PLANE 1

| | | | | | | | | |
|---|---|---|---|---|---|---|---|---|
| PAGE 0 | 0 | 0 | 0 | 0 | 0 | 0 | (1,1) | (1,0) | BLK 1
| PAGE 1 | 0 | 0 | (1,5) | (1,4) | 0 | 0 | 0 | 0 |

PLANE 2

| | | | | | | | | |
|---|---|---|---|---|---|---|---|---|
| PAGE 0 | 0 | 0 | 0 | 0 | (1,3) | 0 | 0 | 0 | BLK 4096
| PAGE 1 | 0 | 0 | 0 | 0 | 0 | 0 | 0 | 0 |

PLANE 3

| | | | | | | | | |
|---|---|---|---|---|---|---|---|---|
| PAGE 0 | 0 | 0 | (2,5) | (2,4) | 0 | 0 | 0 | 0 | BLK 4097
| PAGE 1 | 0 | 0 | 0 | 0 | 0 | 0 | 0 | 0 |

US 7,934,074 B2

FLASH MODULE WITH PLANE-INTERLEAVED SEQUENTIAL WRITES TO RESTRICTED-WRITE FLASH CHIPS

RELATED APPLICATION

This is a continuation-in-part (CIP) of the co-pending application for "Electronic Data Storage Medium with Fingerprint Verification Capability", U.S. Ser. No. 11/624,667 filed Jan. 18, 2007, and "Flash Memory Controller for Electronic Data Flash Card" U.S. Ser. No. 11/466,759, filed Aug. 23, 2006, which is a CIP of "System and Method for Controlling Flash Memory", U.S. Ser. No. 10/789,333, filed Feb. 26, 2004.

This application is related to "Flash memory device and architecture with multi level cells", U.S. Ser. No. 10/800,228, filed Mar. 12, 2004, now U.S. Pat. No. 7,082,056, and "Flash drive/reader with serial-port controller and flash-memory controller mastering a second RAM-buffer bus parallel to a CPU bus", U.S. Ser. No. 10/605,140, filed Sep. 10, 2003, now U.S. Pat. No. 6,874,044.

FIELD OF THE INVENTION

This invention relates to flash-memory solid-state-disk systems, and more particularly to plane-interleaving of flash memory with restrictive write chips.

BACKGROUND OF THE INVENTION

Personal computers, servers, video recorders, and many other kinds of electronic devices use flash-memory "disks" for mass storage. Mass storage is used to store large amounts of data that is typically copied to a faster random-access memory such as a dynamic-random-access memory (DRAM) for use by a processor. While the processor's DRAM is randomly accessible, mass storage is block-accessible. An entire block of data must be read or written from the mass storage device. A RAM may allow reading and writing of individual bytes or words of 4 or 8 bytes, while a mass storage device requires that a sector or 512 bytes or more be read or written together.

Flash memory may also be used as a mass storage device in lieu of a hard disk. Flash-memory arrays are also block-accessible, but have a much faster access time than rotating media such as a hard disk. However, since flash memory chips are block-addressable rather than randomly-accessible, flash is not as easy to use for a cache as DRAM or SRAM.

FIG. 1 shows a prior-art system using flash memory. Host PC 10 generates logical sector addresses (LSA) of a 512-byte block of data to be read or written from a mass storage device. Flash memory 14 can only be erased a block at a time. Flash memory mapper 12 converts LSA logical addresses from host PC 10 into physical block addresses (PBA) that identify a physical block of data in flash memory 14. Flash memory mapper 12 may use re-mapping tables to perform the address translation, and may perform other flash-related functions such as wear-leveling to spread erasures over blocks in flash memory 14. An erase count may be kept for each block in flash memory 14, and the block with the lowest erase count is selected to receive new data.

FIG. 2A shows blocks and pages within an older single-level-cell (SLC) flash memory. Older flash memory chips used electrically-erasable programmable read-only memory (EEPROM) memory cells that stored one bit of data per memory cell. While an entire block had to be erased together, pages within a block could be written and over-written several times. For example, block PBA0 contains stale data in pages PG0, PG1, PG2, PG3, and could be erased as a block. However, block PBA1 has stale data in pages PG0, PG3, while currently valid data is in pages PG1, PG2.

Some older single-level-cell flash memory chips may allow over-writing of pages that have previously been written. Then stale pages PG1, PG2 could be over-written with new valid data. Since flash memory mapper 12 (FIG. 1) can remap LSA's to PBA's, any data could be stored in any page in flash memory 14, regardless of its logical address LSA. Thus physical blocks in flash memory 14 could be re-filled by over-writing stale pages with new data. Blocks with all stale pages could be erased and re-used.

FIG. 2B shows blocks and pages within a newer multi-level-cell (MLC) flash memory. Newer flash memory chips use EEPROM memory cells that stored two, four, or more bits of data per memory cell. Different amounts of charge stored on the floating gates produce different current and different sensing voltages for the same memory cell. Thus a single memory cell can store multiple bits of information by assigning different voltages to different logic levels. For example, sensing voltages near Vcc are read as a logic 11, voltages near ground are a logic 00, voltages above Vcc/2 and below 0.8 Vcc are a logic 10, and voltages below Vcc/2 but above 0.2*Vcc are a logic 01.

Multi-level-cell flash memory can store a higher density than single-level cell flash for the same cell size. Thus multi-level cell flash is likely to be used more frequently for higher-density flash chips made now and in the future. However, MLC flash chips may impose additional restrictions on usage. For example, a MLC flash chip may not allow pages to be written a second time before erase. Instead, the entire block must be erased before any page can be written again. Each page may be written only once after each erase. Alternately, some writing may be allowed, such as writing a 1 bit to a 0 bit, but other writes are not allowed, such as writing a 0 bit to a 1 bit. Some MLC flash chips may be even more restrictive, only allowing pages to be written in a sequence within a block, and not allowing pages to be written out-of-order.

In FIG. 2B, valid data was written to pages PG0, PG1, PG2, PG3 in blocks PBA1, PBA2, PBA3, but later pages PG1, PG2 in block PBA1 became stale as newer data was written to a newer block in flash memory 14. Pages PG1, PG2 in block PBA1 are marked as stale, while the data in these pages is left in the pages. Since there are still valid data in pages PG0, PG3 in block PBA1, block PBA1 cannot be erased yet. Half of the space in block PBA1 contains stale data, while half contains valid data. Other blocks may have more stale pages, such as block PBA2, which has 3 stale pages. However, the one page of valid data, page PG1, prevents block PBA2 from being erased and re-used.

Since the valid data may not be replaced for a long time, if ever, blocks may contain a mix of stale and valid pages. The stale pages are wasted space in flash memory 14. When these stale pages are in blocks with valid pages, the wasted space is not recovered and remains. The amount of stale pages per block varies, but can average 50%, resulting in perhaps 50% wasted space in flash memory 14 once all blocks are used. This wasted space is undesirable, since flash memory 14 may over time eventually use all blocks, with no erased blocks available for new data.

The limitations of newer MLC flash memory may thus result in more wasted space. Stale pages that cannot be over-written are wasted space when valid data in the same block is present.

BRIEF DESCRIPTION OF THE DRAWINGS

FIG. 1 shows a prior-art system using flash memory.

FIG. 2A shows blocks and pages within an older single-level-cell (SLC) flash memory.

FIG. 2B shows blocks and pages within a newer multi-level-cell (MLC) flash memory.

FIGS. 11A-E show an example of plane interleaving several write transactions to flash-memory modules.

DETAILED DESCRIPTION

The present invention relates to an improvement in flash memory controllers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
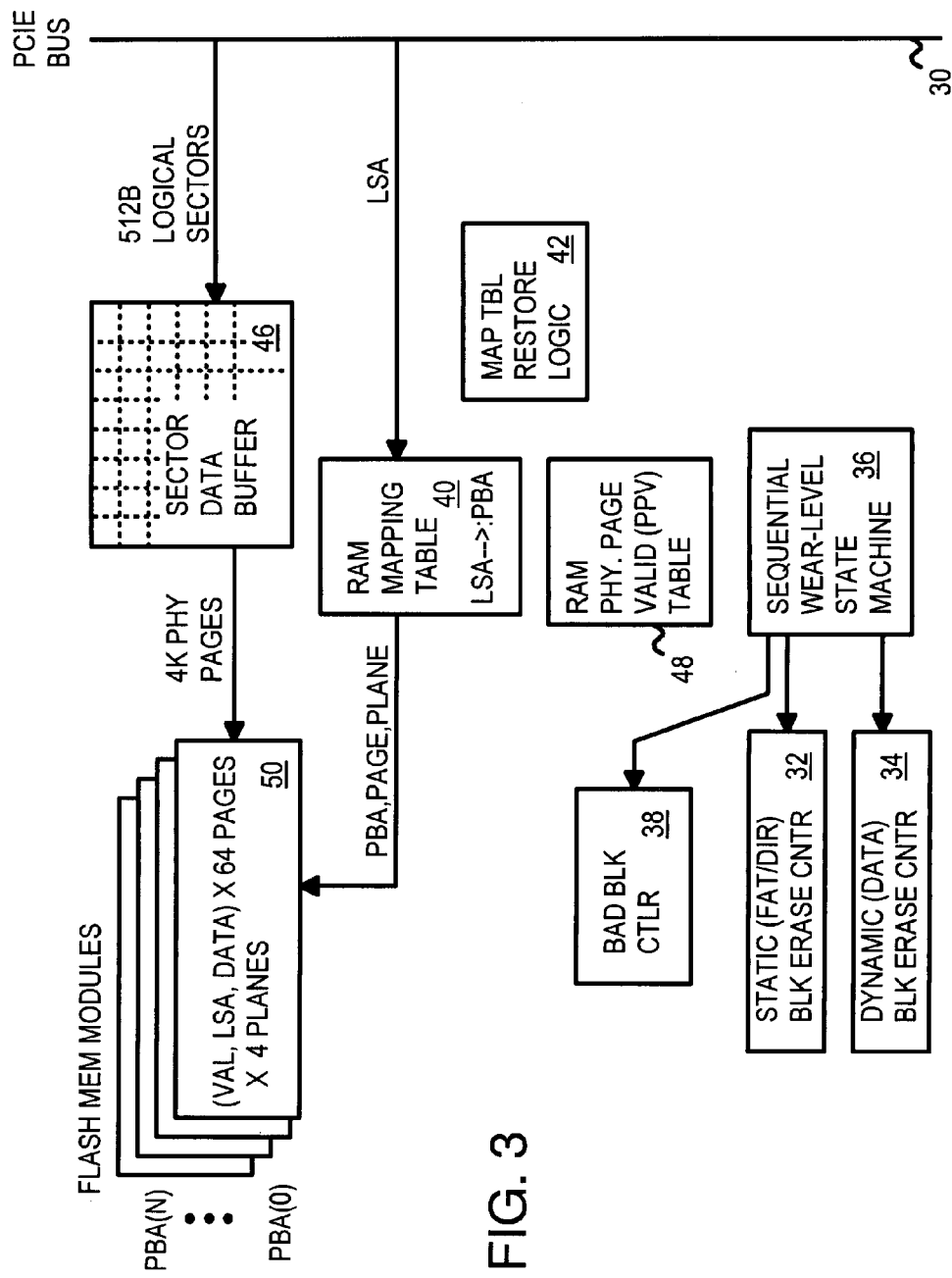
FIG. 3 is a block diagram of a flash-memory card.

FIG. 3 is a block diagram of a flash-memory card. The flash-memory card connects to a host PC through an external I/O processor over PCIE bus 30. The flash-memory card generates packets and performs handshaking in response to commands received over PCIE bus 30.

Sector data buffer 46 stores 512-byte sectors of data from the host that are to be written to pages in flash-memory modules 50. Several sectors are combined to form 4K-byte pages that are written into flash-memory modules 50.

The LSA sector address can be extracted from the command sent over PCIE bus 30. The LSA sector address is a logical address from host PC 10, rather than a physical address within a hard-disk or other mass-storage device. The LSA sector address can be looked up in RAM mapping table 40 to find the physical block address (PBA). The PBA is a physical address of a block of flash-memory modules 50.

RAM mapping table 40 stores LSA to PBA mappings for sectors in flash-memory modules 50. RAM mapping table 40 provides a fast way to determine which PBA in flash-memory modules 50 to access. Each PBA is divided into several pages, such as 64 pages, or some other number. Each page holds one sector of data, and also stores the LSA for the data, and valid and stale bits in a spare area.

Flash-memory modules 50 are further arranged into 4 planes, each with 64 pages. Arranging flash memory into planes improves performance since interleaving of pages can be achieved with higher throughput. Each of flash-memory modules 50 could support 4 planes, or each separate flash-memory modules 50 could be one plane.

The flash memory controller can look up the LSA in RAM mapping table 40 to find the PBA, then read the physical block for that PBA from flash-memory modules 50. The LSA's for each page in that PBA are read and compared to the LSA from the host's request to determine if a match occurred. The flash-memory controller then examines the page's valid bits to validate the match and reads or writes the data. Read data or a write response can be sent back to the host PC in a command or packet over PCIE bus 30.

RAM physical page valid table 48 contains valid and stale bits for pages in flash-memory modules 50. These valid and stale bits can be accessed and updated by the flash memory controller such as to mark as stale an old page of valid data that is being replaced by new write data in another page location in flash-memory modules 50. New data written into an erased page has its valid bit set to valid, while all pages in a block being erased are marked as erased.

Mapping table restore logic 42 is activated when power is lost and restored, causing loss of mapping data in RAM mapping table 40 and RAM physical page valid table 48. Mapping table restore logic 42 reads the spare areas of block in flash-memory modules 50 to re-construct RAM mapping table 40 and RAM physical page valid table 48.

Sequential wear-leveling state machine 36 updates bad block counter 38 when a bad block is located, and uses erase counters 32, 34. Erase counter 32 tracks the erase count for less-frequently-changed blocks, such as boot blocks, application program code, etc. Erase counter 34 is used for frequently-changing blocks, such as user data. Sequential wear-leveling state machine 36 performs wear-leveling of physical blocks of flash-memory modules 50 by relocating pages and blocks as described in more detail in subsequent drawings and description.

Figure 4:
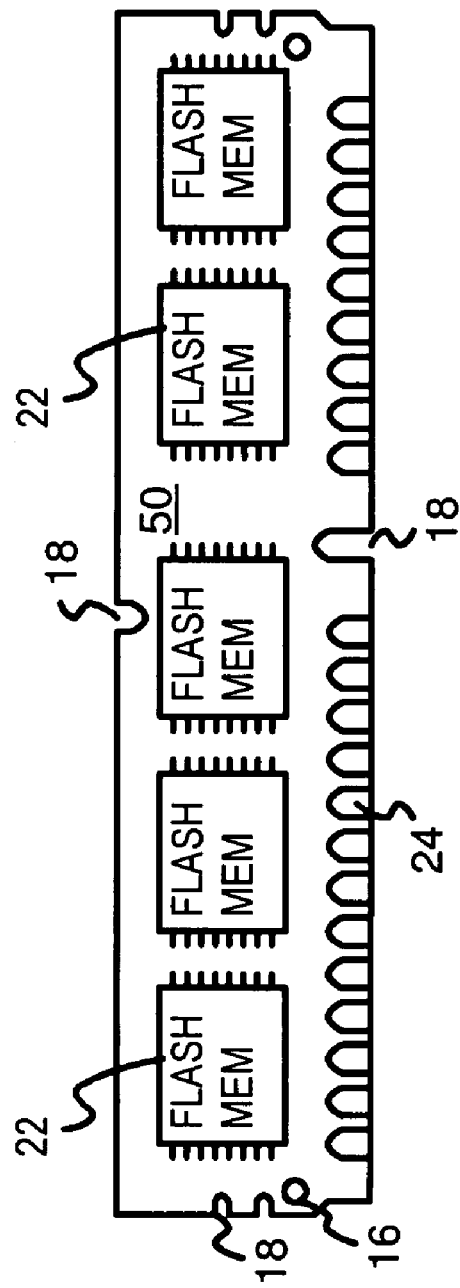
FIG. 4 shows a flash memory module.

FIG. 4 shows a flash memory module. Flash memory module 50 contains a substrate such as a multi-layer printed-circuit board (PCB) with surface-mounted flash-memory chips 22 mounted to the front surface or side of the substrate, as shown in FIG. 4, while more flash-memory chips 22 are mounted to the back side or surface of the substrate (not shown).

Metal contact pads 24 are positioned along the bottom edge of the module on both front and back surfaces. Metal contact pads 24 mate with pads on a module socket to electrically connect the module to a PC's motherboard. Holes 16 are present on some kinds of modules to ensure that the module is correctly positioned in the socket. Notches 18 also ensure correct insertion of the module. Capacitors or other discrete components are surface-mounted on the substrate to filter noise from flash-memory chips 22.

Figure 5:
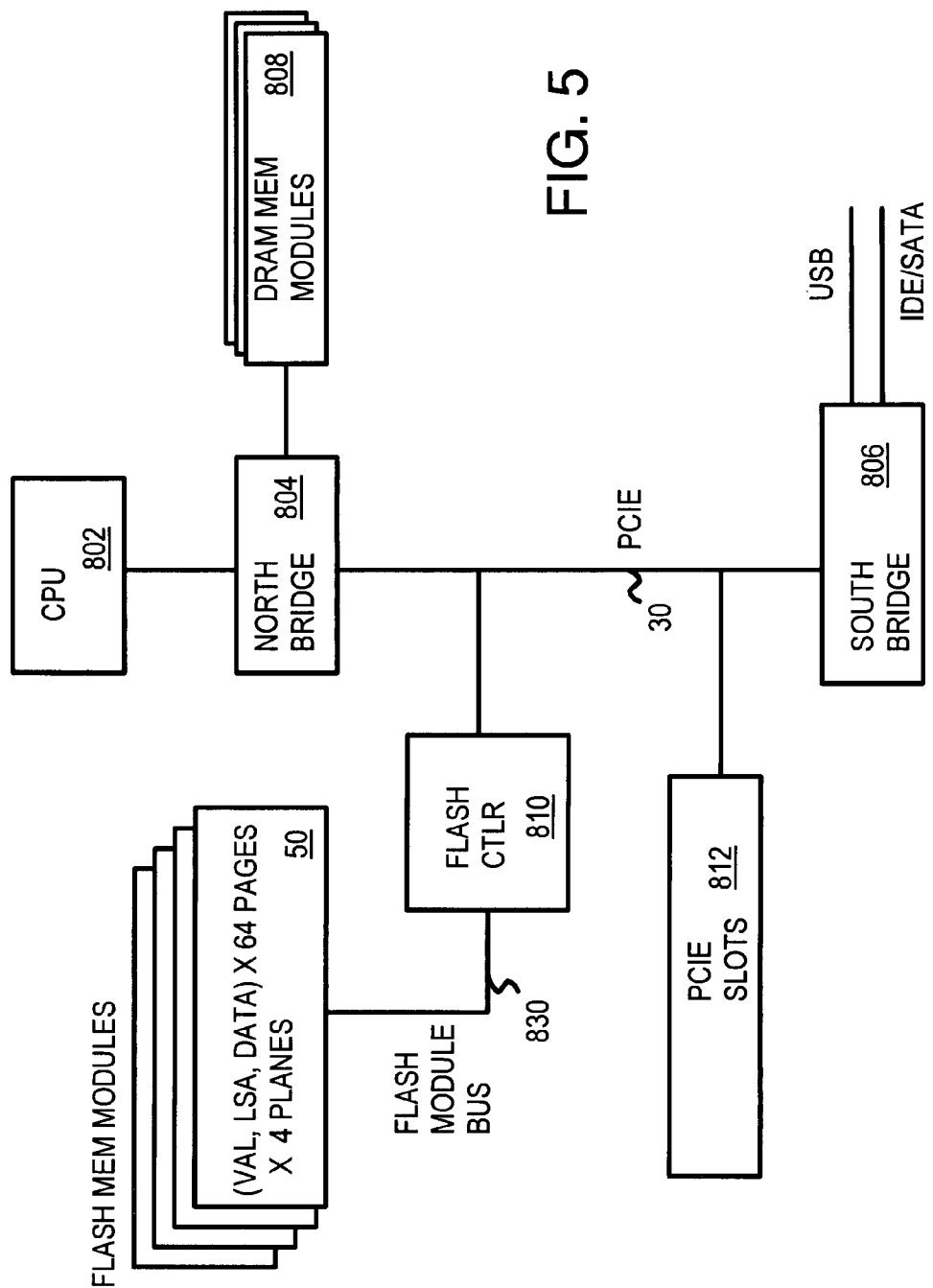
FIG. 5 shows plane-interleaved flash-memory modules in a host system.

FIG. 5 shows plane-interleaved flash-memory modules in a host system. Central Processing Unit (CPU) 802 is a processor that executes instructions from programs and data in a main memory that includes Dynamic Random Access Memory (DRAM) memory modules 808 that are accessed through north bridge controller 804. Slower peripherals such as network adaptors and mass storage devices such as hard disks may reside on peripheral buses such as USB, IDE, or SATA buses that are controlled by south bridge controller 806. PCI express PCIE bus 30 links north bridge controller 804 with south bridge controller 806. PCIE slots 812 allow PCIE devices to be plugged into PCIE bus 30.

Flash controller 810 is connected to PCIE bus 30. Flash controller 810 sends data, address, and control information to flash-memory modules 50 over flash module bus 830. Flash controller 810 can include components shown in FIG. 3, such as RAM mapping table 40 and RAM physical page valid table 48.

Figure 6:
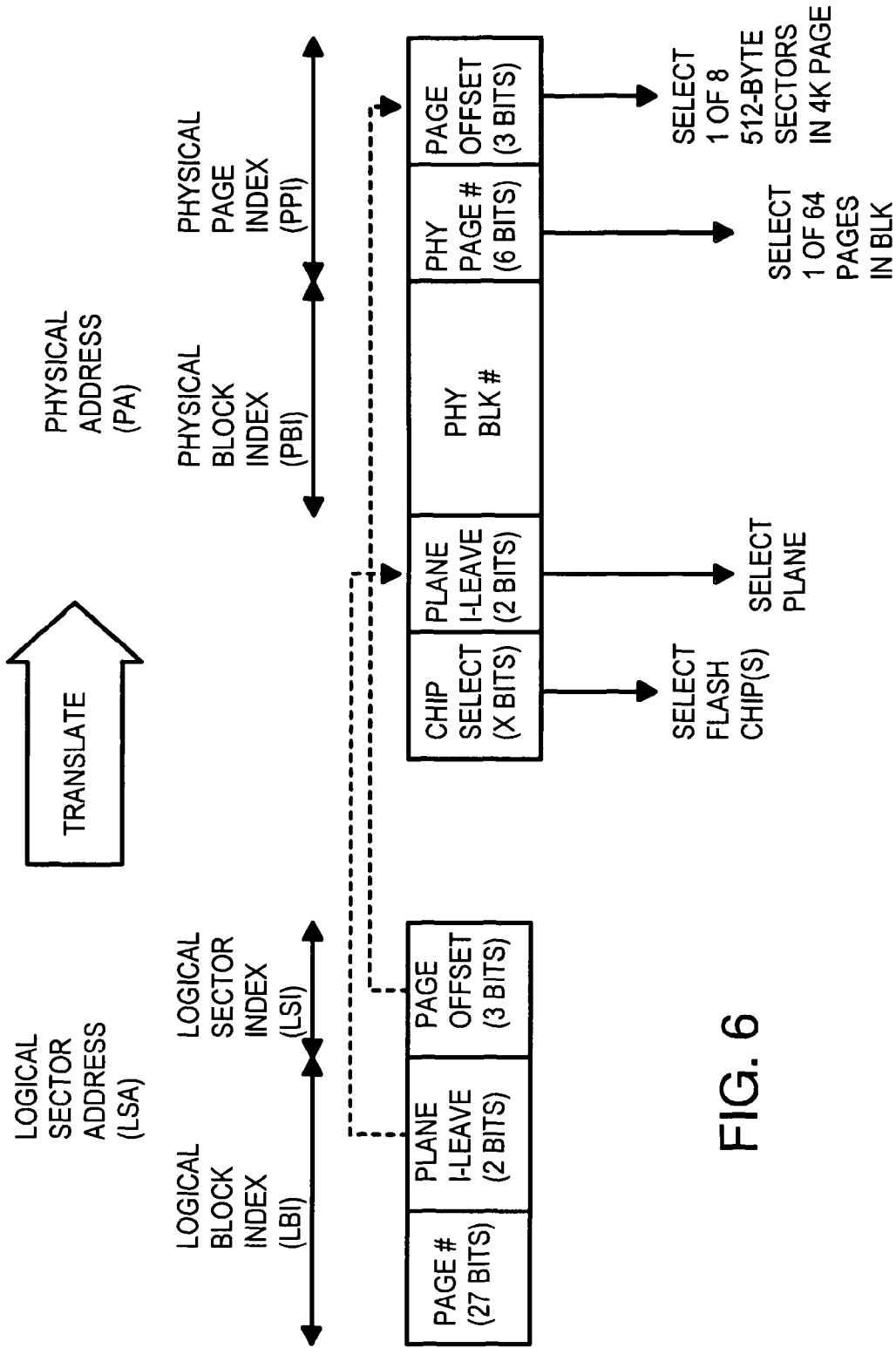
FIG. 6 highlights address translation with plane interleaving.

FIG. 6 highlights address translation with plane interleaving. A logical sector address (LSA) from the host is translated into a physical address for the flash-memory modules. The LSA can be divided into a logical block index (LBI) and a logical sector index (LSI). The LBI includes a 27-bit page number and a 2-bit plane interleave, while the LSI includes a 3-bit page offset, which identifies one 512-byte sector within a 4K-byte page.

The physical address has three parts, rather than just 2 parts. The lowest 3 bits of the physical address identify one of 8 sectors in a page. These physical page offset bits can be copied from the logical page offset bits of the logical sector address. The physical page index (PPI) also includes a 6-bit physical page number, which selects one of 64 pages within a physical block in the flash-memory modules.

The physical block index (PBI) identifies a physical block within a chip and a plane. The bits of the PBI and the physical page number are generated by the RAM mapping table from the LBI.

The physical address has interleave bits in the upper bit-positions. The 2 plane-interleave bits are extracted from the middle of the logical sector address and moved to the upper bit-positions in the logical address. The 2 plane interleave bits select one of four planes within the flash-memory modules.

Additional upper bits select a flash chip from among several flash chips. These upper chip-select bits are optional, but may allow for expansion and further performance improvement of the flash system. A mapping table may store the physical block #, the physical page #, and the chip-select bits.

Taking bits from the middle of the LSA and moving them to the top of the physical address for use in plane interleaving. Plane-interleaving may reduce wait states by allowing writes to additional planes when one plane is being written.

Figure 7:
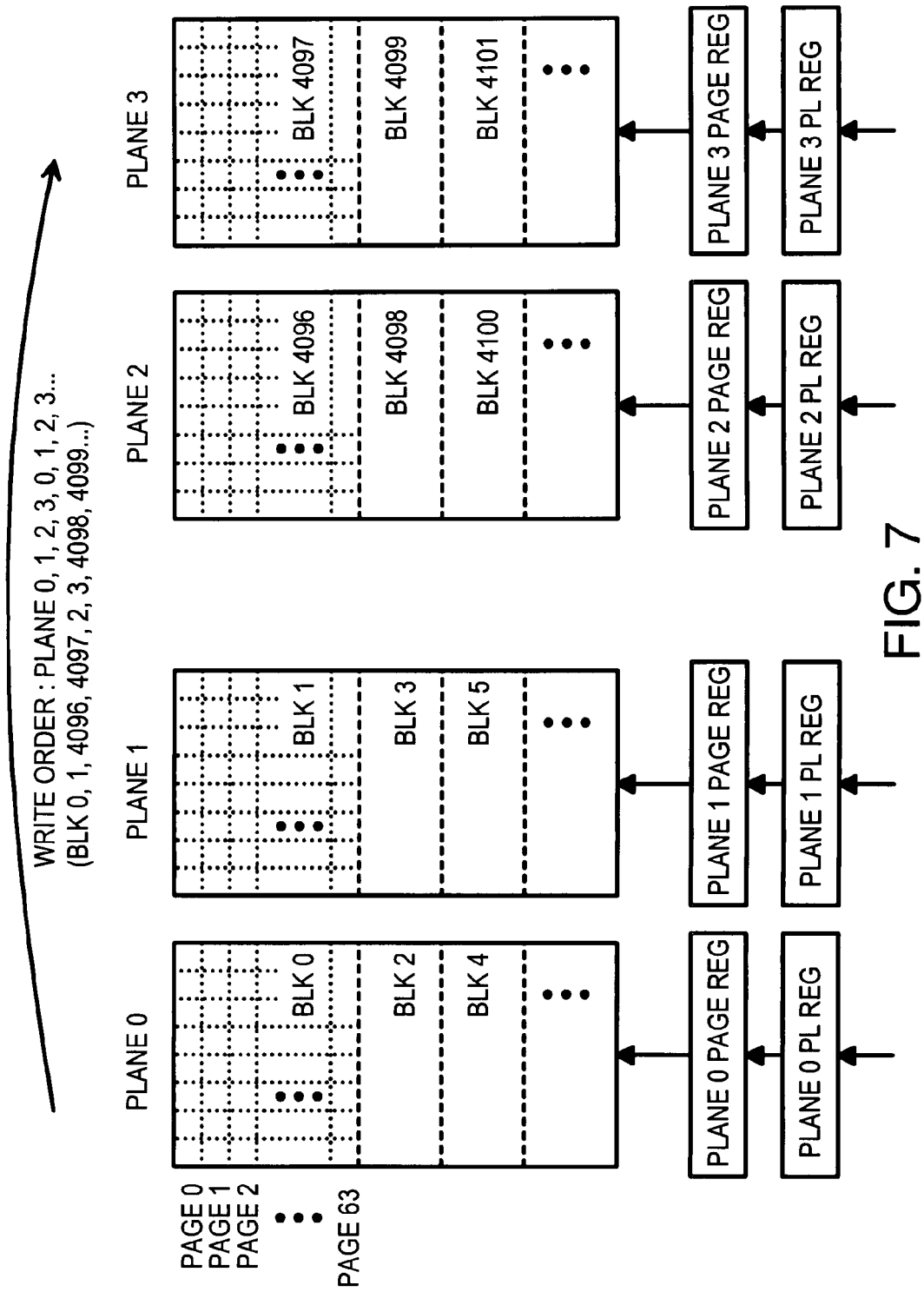
FIG. 7 highlights plane interleaving with a sequence of writes.

FIG. 7 highlights plane interleaving with a sequence of writes. Each 4K-byte physical page has 8 sectors. Logical sectors of data from the host are buffered until a full page is formed. Sometimes a partially-full page must be written to flash memory. The page of data is loaded into a pipeline register for one of the four planes, depending on the 2 plane-interleave bits for that data's physical address. The data in a plane's pipeline register is shifted to that plane's page register and then written into a page in that plane's flash-memory module. Each plane's pipeline register can hold 4K bytes, or one full page of data. One flash-memory chip can have several planes that allow parallel access. For example, one flash chip may support 4 planes, or tow flash chips may be used, each supporting 2 planes. The chip-select bits may be used for extended chip interleaving when each flash chip can support all 4 planes.

A sequential stream of host data is written across the four planes in plane order. Planes 0, 1, 2, 3 are written, then planes 0, 1, 2, 3 are written again, with further writes continuing to loop through the four planes. The first write may be to one of planes 1, 2, 3 rather than to plane 0.

Rather than write to the same physical block, each plane writes to a different physical block. Writes to plane 0 first write the 64 pages in block 0, then the 64 pages in block 2, then pages in block 4, and so on. Writes to plane 1 first write the 64 pages in block 1, then the 64 pages in block 3, then pages in block 5, and so on. Writes to plane 2 first write the 64 pages in block 4096, then the 64 pages in block 4098, then pages in block 4100, and so on. Writes to plane 3 first write the 64 pages in block 4097, then the 64 pages in block 4099, then pages in block 4101, and so on.

Planes 0, 1 write to lower blocks 0, 1, etc. while planes 2, 3 write to higher blocks 4096, 4097, etc. Wait states are reduced since multiple planes may be written at the same time with plane-interleaving.

Figure 8:
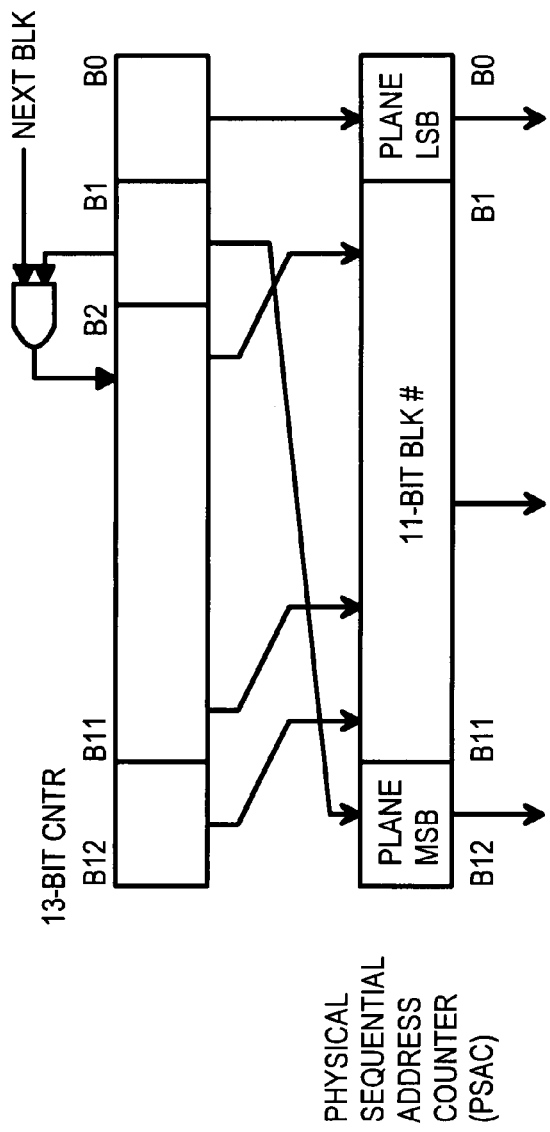
FIGS. 8A-B show a physical sequential address counter for plane interleaving.

FIGS. 8A, 8B show a physical sequential address counter for plane interleaving. In FIG. 8A, a physical sequential address counter (PSAC) is incremented as each physical block is filled in. Each physical block has 64 pages, with 8 sectors per page. The beginning of a write sequence may start in the middle of a page, and at any plane.

The bits in a 13-bit counter are incremented for each new plane/block. The bits in the upper 13-bit counter increment in standard binary counting order. However, these bits are re-arranged into the ordering shown in the bottom blocks. The least-significant bit (LSB) is copied to become the LSB of the 2 plane-interleave bits. Then penultimate LSB is moved to the upper, most-significant bit (MSB) position, and becomes the MSB of the 2-bit plane-interleave bits. The other 11 bits from the binary counter are placed between the MSB and LSB of the 2-bit plane interleave and form the 11 middle bits of the 13-bit block number. Thus the plane interleave bits are split up, with other bits from the counter between them.

FIG. 8B shows the counting sequence with split plane-interleave bits of the physical sequential address counter. The plane-interleave LSB toggles for each plane/block. The plane-interleave MSB toggles for every other plane/block, but this bit is moved to above the 11 middle block bits. Thus the blocks accessed are block 0, 1, 4096, 4097. A logic gate can be added between bits B1 and B2 in the binary counter so that bits B2 and above (the 11 middle block bits) change only when a block fills up. Thus blocks 0, 1, 4096, 4097 are repeatedly looped through, up to 64 times, until all 64 pages are filled. Then the logic allows bit 2 to change, allowing the block number to increment, and then blocks 2, 3, 4099, 4099 are repeatedly accessed for 64 times before the blocks are again updated.

When the physical sequential address counter reaches a block that is a bad block, an extra "dummy" toggle signal can be generated to skip over the bad block. A group of 4 blocks may be skipped rather than just the one bad block, in some embodiments.

Figure 9:
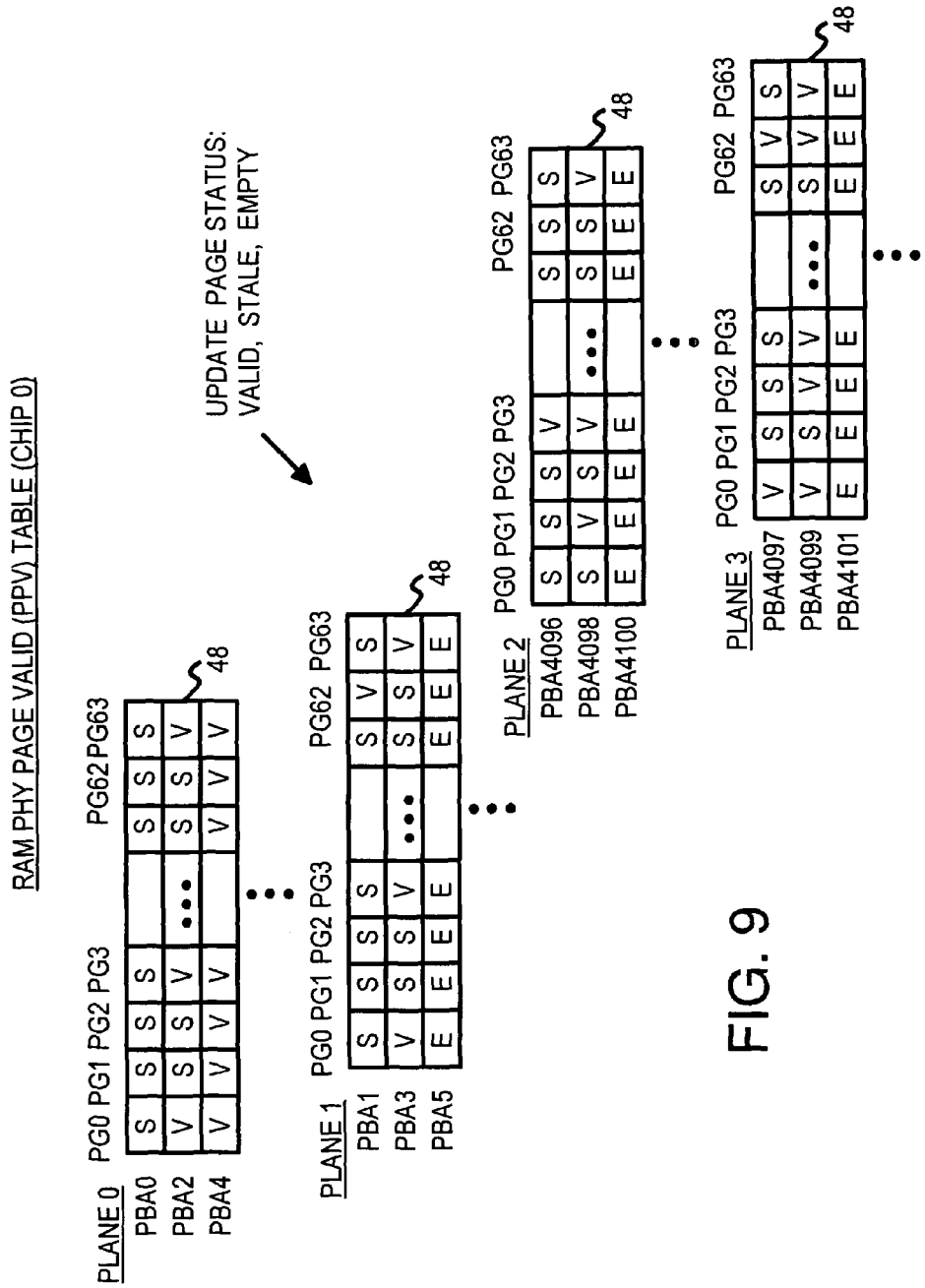
FIG. 9 shows the RAM physical page valid table for plane-interleaved flash-memory modules.

FIG. 9 shows the RAM physical page valid table for plane-interleaved flash-memory modules. The RAM physical page valid table shown in FIG. 9 is repeated for each chip when more than one flash chips are interleaved. Blocks 0, 2, 4, 6, 8, . . . are in plane 0 of RAM physical page valid table 48, blocks 1, 3, 5, 7, . . . are in plane 1 of RAM physical page valid table 48, blocks 4096, 4098, 4100, 4102, . . . are in plane 2, and blocks 4097, 4099, 4101, 4103, . . . are in plane 3 of RAM physical page valid table 48.

Each physical block has 64 pages, and each block's entry in RAM physical page valid table 48 has 64 valid bits. The valid bits for a page can be set to erased (E), valid (V), and stale (S). After a block is erased, such as block PBA5 in plane 1, all pages have valid bits set to the erased state. When data is written to a page, that page's valid bit changes from erased to valid (V), such as pages in PBA4 in plane 0. When the host updates the data in a page, the old page's valid bit changes from valid to stale, and the new data is stored somewhere else, such as in a different block.

When all pages in a block are stale, such as block PBA0 in plane 0, the block can be erased and recycled. When there are still some valid pages in a mostly-stale block, the valid pages could be copied to a new location and the block erased.

Figure 10:
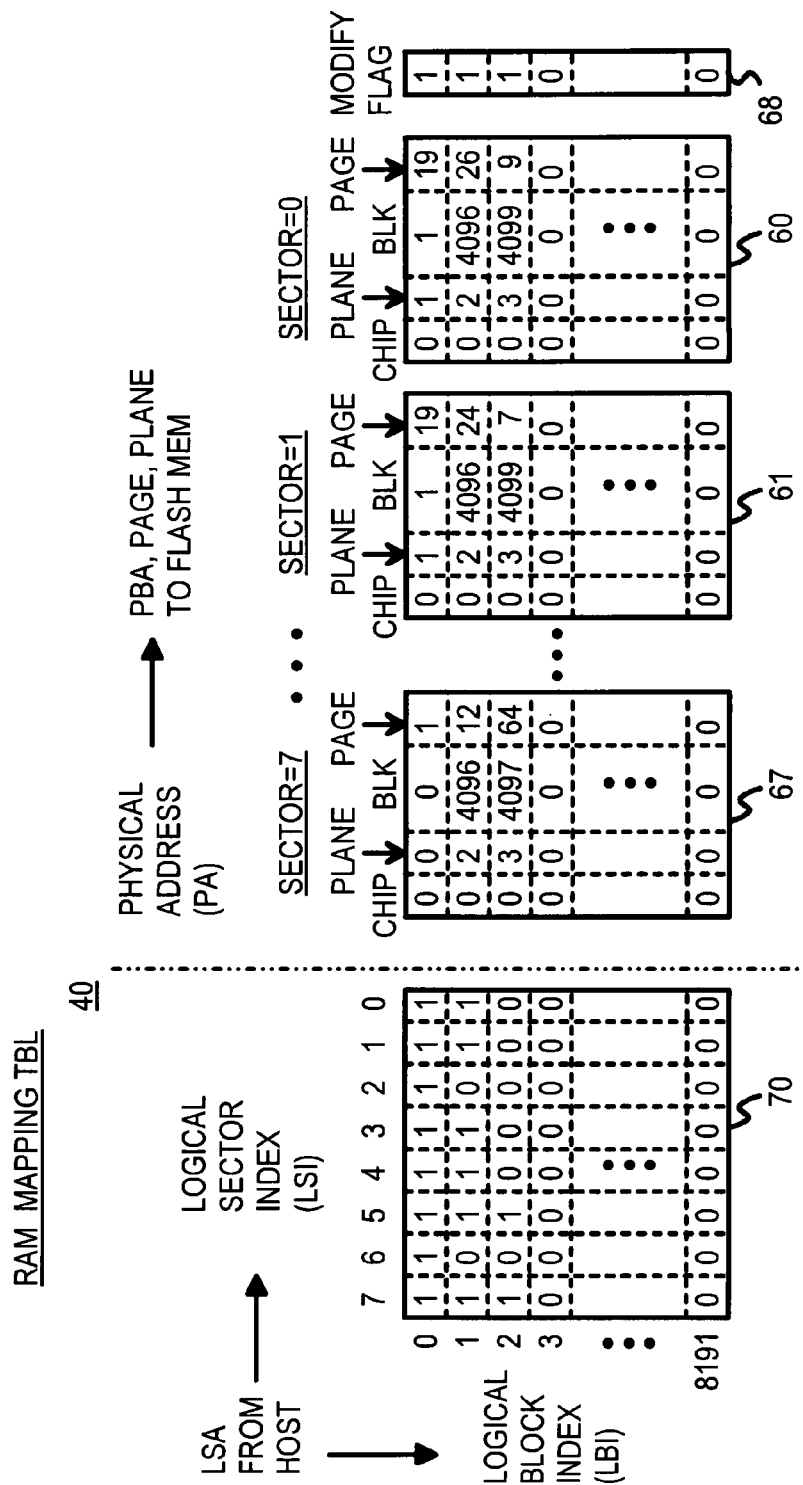
FIG. 10 shows a RAM mapping table for a plane-interleaved flash system.

FIG. 10 shows a RAM mapping table for a plane-interleaved flash system. RAM mapping table 40 converts a logical sector address (LSA) from a host into a physical address for the flash-memory modules. The LSA is divided into a LBI and a LSI. The LBI selects a row corresponding to the block of the LBI, while the LSI selects one of 8 sectors for that row's logical block in logical table 70. Each intersection of block/row and sector/column corresponds to one logical sector. The bit for that sector I set to 1 to indicate that the mapping in RAM mapping table 40 has valid data, or 0 to indicate that the mapping or its data is not valid.

Each row or logical block in logical table 40 has a corresponding row in the physical side of RAM mapping table 40. The physical side is divided into 8 sector tables 60, 61, 62, . . . 67 for the 8 logical sectors in the logical block. Since each physical page is 4K bytes, there are also 8 sectors per physical page, but the logical sectors from a logical block could be mapped to different blocks. For example, logical block 2 has logical sector 7 mapped to physical block 4097, while logical sectors 1 and 0 are mapped to a different physical block 4099, as shown in sector tables 67, 61, 60.

Each row in each of sector tables 60, 61, . . . 67 stores the physical chip, plane, block, and page number that the logical sector is stored in. Since a physical block has 64 pages, while a logical block has only 8 sectors, many logical sectors may be stored in each block. For example, logical block 1, logical sectors 7, 1, and 0 are all stored in physical block 4096 of plane 2, but in pages 12, 24, 26, respectively.

Modify flags 68 are set to 1 for a row or logical block when there is a valid, non-stale mapping in that row. Modify flags 68 are 0 for rows for logical blocks that have only stale pages or have not yet had any logical sectors mapped to physical blocks.

The chip, plane, block, page entries in sector tables 60, 61, . . . 67 may be generated by a physical sequential address counter such as that shown in FIG. 8A-B. The plane interleave bits can be toggled until all 64 pages have been filled in the 4 blocks in all 4 planes, and then the middle block bits may be toggled to advance to the next set of four blocks. The value of the physical sequential address counter can be loaded into rows of sector tables 60, 61, . . . 67 as the physical mappings for a sequence of logical sectors. Since each 4K-byte page stores up to 8 sectors, up to 8 logical sectors may be accumulated in the pipeline registers (FIG. 7) before the physical page is written. The 8 logical sectors in a logical block could be written to different physical pages when the sectors are not page-aligned.

FIGS. 11A-E show an example of plane interleaving several write transactions to flash-memory modules. In FIG. 11A, a host transaction (0,1,9) is a write starting at LBI=0, LSI=1, and has a length of 9 sectors. This transaction is a series of 9 sector writes to (LBI,LSI) of (0,1), (0,2), (0,3), (0,4), (0,5), (0,6), (0,7), (1,0), (1,1). Note that sector (0,0) is not written. Seven sectors are written in the first logical block and 2 more sectors are written in the next logical block.

The flash controller uses the logical sector index as the physical page offset within a page, so sector ordering is the same for logical and physical sides of the translation. Sector offsets are not re-arranged within the physical page.

The physical sequential address counter is initially set to 0,0,0,0 for chip, plane, block, and page all 0. Data from logical sectors (0,1), (0,2), (0,3), (0,4), (0,5), (0,6), (0,7) are written to chip 0, plane 0, block 0, and page 0, as shown in the first row for page 0 of block 0. The first sector in physical page 0 is empty.

The remaining 2 sectors (1,0), (1,1) do not fit in page 0, block 0. Instead, the physical sequential address counter is incremented, causing the LSB plane interleave bit to toggle to 1. The block and plane numbers are now 1. Thus data from sectors (1,0), (1,1) is written to block 1 in plane 1. Page 0 is written in both planes 0, 1.

In FIG. 11B, another host transaction (1,3,1) is received, which writes one sector (1,3). Since this is a new transaction, the physical sequential address counter is incremented. This time both the MSB and LSB of the plane interleave bits toggle. The plane-interleave's MSB is moved to bit-position 12, above the middle 11 block bits, so that the block number is 2^12 or 4096, since the LSB toggles back to 0.

The data from logical sector (1,3) is written to sector offset 3 in page 0 of block 4096 for plane 2. Performance can be enhanced since the writing of flash memory for plane 2 can overlap the actual writing of flash in planes 0, 1, rather than first wait for writing in planes 0, 1 to finish.

In FIG. 11C, a 2-sector-long write is received, (2,4,2), starting a logical sector (2,4) and finishing at (2,5). The physical sequential address counter is again incremented, toggling the plane-interleave LSB to 1 but leaving the MSB at bit-position 12 at 1. The block accessed is block 4097 and the plane is 3 (11). Data for sectors (2,4) and (2,5) are written to page offsets 4 and 5 in page 0 of block 4097 in plane 3 as shown.

In FIG. 11D, the host writes 3 sectors starting at (0,0). Since the next 2 sectors of this transaction over-write sectors (0,1), (0,2), which were written in FIG. 11A, the old data (0,1), (0,2) becomes stale since it is replaced with new data (0,1)N, (0,2)N.

The flash memory chips do not allow over-writing of stored data, since the flash chips may have multiple logic levels per physical memory cell. Instead, the old data for all sectors from page 0 must be read into a buffer, then merged with the new data, and written to a new page in flash memory.

Data from logical sectors (0,1), (0,2), (0,3), (0,4), (0,5), (0,6), (0,7) are read from page 0, block 0 of plane 0. This page location is found from a lookup in RAM mapping table 40 (FIG. 10). The new data (0,0), (0,1)N, (0,2)N is then merged with the old data, over-writing the old data (0,1), (0,2) to form the merged data (0,0), (0,1)N, (0,2)N, (0,3), (0,4), (0,5), (0,6), (0,7). This merged data (0,0), (0,1)N, (0,2)N, (0,3), (0,4), (0,5), (0,6), (0,7) is then written to a new page in the flash-memory modules.

The new page is found by incrementing the physical sequential address counter. Both the LSB and MSB of the plane interleave bits toggle back to 0, so plane 0 is accessed and block 0. However, the page number increments to page 1 in block 0. So this merged data is written to page 1 of block 0. The old data in page 0 block 0 is marked as stale in RAM physical page valid table 48.

In FIG. 11E, the host writes 2 sectors (1,4), (1,5). The physical sequential address counter is incremented, with the plane-interleave bits changing from 00 to 01, pointing to plane 1. Block 1 is still accessed, but the page was changed to page 1 in FIG. 11D. So the new data (1,4), (1,5) is written to sector offsets 4, 5 in page 1 of block 1.

The next data transaction (not shown) would start in page 1 of plane 2, block 4096. Toggling of the physical sequential address counter for each new transaction, or when a page fills up, allows writes to be interleaved across planes, improving performance by allowing parallel writing.

Alternate Embodiments

Several other embodiments are contemplated by the inventors. Rather than have just 2 plane-interleave bits for 4 planes, additional plane-interleave bits may be added to interleave among more planes of flash. Some number of physical blocks, such as 8192, may be allocated for data, while other blocks are allocated for system uses such as wear-leveling.

For example, the number of pages per block can be some other number than 64. The number of physical blocks in the system can increase, and blocks can be partitioned among the data and overhead pools in various ways and also dynamically. The sector size could vary from the 512-byte sector described. The page size can be 4K bytes or higher, such as for multi-level cell flash memory, but the sector size inherited from hard disk drives may remain 512 bytes for compatibility reasons. Other bits may be stored with each page or with each block, such as LRU bits, management or coherency bits, dirty bits, other counters, etc.

Some blocks may be faulty and are removed from the pool of erased blocks. The physical sequential address counter can be incremented again to skip over these faulty pages or blocks. The physical sequential address counter does not have to follow a loop of sequential binary block numbers, but could use other sequences, such as gray code loops, ascending or descending values, or any sequence. The sequence could be modified for wear-leveling, bad blocks, or other reasons.

While the flash-memory card has been described as being on a Peripheral Component Interconnect Express (PCIE) bus with a PCIE interface, it also could have a USB interface to a USB bus. The input/output interface circuit could be any one of a Secure Digital (SD) interface circuit, a Multi Media Card (MMC) interface circuit, a Compact Flash (CF) interface circuit, a Memory Stick (MS) interface circuit, a PCI-Express interface circuit, a Integrated Drive Electronics (IDE) interface circuit, a Serial Advanced Technology Attachment (SATA) interface circuit, an external SATA Interface Circuit, or a Radio Frequency Identification (RFID) interface circuit. Rather than being on a card, the device might be a module or may be located on one or more chips or on several boards or on a motherboard.

Different kinds of flash memory may erase to 0, and only allow writing to 1, not writing from 1 to 0. Some flash memory may allow page erase, rather than whole block erase. Events may occur exactly when described, such as incrementing sequence counters at the start of a new block, or could occur at other times. Valid bits may change to the erased state near but not exactly at the time of physical erasing, such as before or after the actual erase operation. Pipelining, buffering, and other time-shifting operations may be used. Wait states that delay operations may be added, such as when erasing is very slow.

Other incrementing procedures or algorithms could be used, such as counting backwards in binary code, gray code, or using 2's complement, rather than right-shifting zeros. Incrementing can refer to decrementing, and bits could be set to 0 rather than just set to 1, or cleared to 1,1, since inverted bit states or polarities may be used.

Hashing such as modulo remainders could be used to map LSA's to RAM entries in RAM mapping table 40. The RAM entries could store other information, and additional memory or registers could be used to store status or program variables that are useful for the flash-memory card or its software drivers.

The physical sequential address counter or other counters may use a counting order other than binary or gray code. For example, the counter may shift in zeros from the right, then shift in ones from the right, such as in the sequence 11111110, 11111100, 11111000, 11110000, . . . etc. Some values in the sequence may be skipped, such as incrementing from 0111111 to 11111110 by skipping 11111111, which is the erased value. Many sequences and variations are possible.

The counter could contain many more bits, such as 32 bits rather than 8 bits, allowing for counting up to 32 without erasing from 0 to 1. Counting sequences that minimize bit changes from 0 to 1 could be used, with bit changes from 0 to 1 occurring when a new current block is started, perhaps by skipping other values in the sequence. Since old blocks are erased, a large count value may not be needed, as the count could be reset periodically when all block have been erased.

Page order may vary, such as by filling odd pages 1, 3, 5 . . . first, then filling even pages 0, 2, 4, . . . . Many other sequences may be substituted. Various other steps such as validating data may be added. The flash-memory card may have its own flash-memory array or may use flash memory on another bus, such as on a USB flash card. Some caching operations or other workload could be processed by the host or by another processor such as the I/O processor, and could be partitioned among software, firmware, and hardware. The flash-memory card could be a printed-circuit board (PCB), a smaller plug-in card or device, a device with an external chassis, a board or rack in a larger chassis, or may be integrated with other components or with the host. The data stored may come from one or more hosts, peripheral devices, bus masters, or various other sources.

Various other criteria may be considered when choosing blocks for use, such as location when blocks are partitioned among buses or physical devices or cards. Additional restriction on choice of the next block can be added, such as limiting the number or location of physical blocks that can map to a particular RAM index. For example, each LSA could be restricted to mapping to only 1 PBA per area. The RAM table may not be needed in some embodiments with restrictions on mapping. Powers of 2 rather than the simplified powers of 10 may be used for the number of RAM entries.

A threshold number of stale pages could be determined. When the first block has less than the threshold number of stale pages, then the valid pages in the first block are not relocated, but remain in place. The threshold number could be adjusted to optimize the tradeoff between wasted space due to stale pages, and relocation overhead.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another a tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A plane-interleaved flash-memory system comprising:
    flash memory arranged as blocks of multiple pages, wherein pages are written and blocks are erased, wherein individual pages are not individually erasable except by erasing all pages in a physical block;
    wherein the flash memory is further arranged into a plurality of planes, that are plane-interleaved and accessible in parallel;
    a volatile logical-physical mapping table storing mapping entries, wherein a mapping entry stores a logical address of data from a host and a physical block address (PBA) indicating a location of the data within the flash memory;
    wherein the mapping entry further comprises a plane number and a page number;
    a binary counter having a least-significant bit (LSB), a second LSB having a higher significance than the LSB, and middle bits having a higher significance than the second LSB;
    a physical sequential address register, coupled to the binary counter, for storing a generated block number, wherein the middle bits have a higher significance than the second LSB in the generated block number, the second LSB being shifted to a higher bit position in the generated block number;
    a page counter indicating the page number in the physical block in the flash memory;
    an interleave incrementer for incrementing the LSB and the second LSB and not incrementing the middle bits when host data is to be written to a new page and all pages in a physical block of a fourth plane have not been yet filled;
    a page incrementer for incrementing the page counter when host data is to be written to a new page and when the LSB and the second LSB indicate the fourth plane and when empty pages are available in the physical block; and
    a block incrementer for incrementing the middle bits when the LSB and the second LSB indicate the fourth plane and no empty pages are available in the physical block;
    wherein the LSB and the second LSB are written to the mapping entry as the plane number, and the page counter is written to the mapping entry as the page number when host data is written to the physical block corresponding to the mapping entry;
    wherein the generated block number is written to the mapping entry as the physical block address, the generated block number having the second LSB shifted to a most-significant bit (MSB) of the physical block address, whereby flash memory is plane-interleaved to different physical blocks using the second LSB as a most-significant bit (MSB) of the physical block address.

2. The plane-interleaved flash-memory system of claim 1 further comprising:
    a first plane register for storing sectors of data in a first page for writing to a first plane in the plurality of planes of the flash memory;
    a second plane register for storing sectors of data in a second page for writing to a second plane in the plurality of planes of the flash memory;
    a third plane register for storing sectors of data in a third page for writing to a third plane in the plurality of planes of the flash memory;
    a fourth plane register for storing sectors of data in a fourth page for writing the fourth plane in the plurality of planes of the flash memory;
    wherein the first, second, third, and fourth pages are written in parallel at a same time;
    wherein the first page is written to a first physical block having a first generated block number;
    wherein the second page is written to a second physical block having a second generated block number that is one greater than the first generated block number;
    wherein the third page is written to a third physical block having a third generated block number that is $2^X$ greater than the first generated block number, wherein X is a number of bits for the middle bits;
    wherein the fourth page is written to a fourth physical block having a fourth generated block number that is one greater than the third generated block number,
    whereby generated block numbers for the third and fourth planes are $2^X$ greater than the generated block numbers for the first and second planes.

3. The plane-interleaved flash-memory system of claim 2 wherein X is 12 and the generated block numbers for the third and fourth planes are 4096 greater than the generated block numbers for the first and second planes.

4. The plane-interleaved flash-memory system of claim 3 wherein each physical block comprises 64 pages.

5. The plane-interleaved flash-memory system of claim 2 further comprising:
    a volatile usage table having valid bits for pages in the flash memory, wherein a valid bit for a page in the flash memory indicates a valid state when the page contains valid data, a stale state when the page contains data that has been replaced by newer data stored in a different page in the flash memory, and an erased state when the page has been erased and not yet written with data from the host.

6. The plane-interleaved flash-memory system of claim 2 wherein the volatile logical-physical mapping table comprises a plurality of sector tables, wherein each sector table stores mapping entries for logical addresses having a same logical sector offset,
    whereby the volatile logical-physical mapping table is arranged by logical sector offsets.

7. The plane-interleaved flash-memory system of claim 6 wherein the volatile logical-physical mapping table further comprises:
    modify flags, wherein each modify flag indicates when data from a logical block has been written to the flash memory.

8. The plane-interleaved flash-memory system of claim 2 wherein the flash memory comprises multi-level-cell (MLC) flash memory that comprises physical memory cells that each store more than one bit of data.

9. The plane-interleaved flash-memory system of claim 8 wherein each page in the flash memory is writeable only once between erases and wherein the flash memory writes host data to pages in a sequential order of pages within a physical block;

wherein out-of-sequence page writing is prohibited by the flash memory.

10. The plane-interleaved flash-memory system of claim 9 further comprising:

an interface circuit which comprises a Secure Digital (SD) interface circuit, Universal Serial Bus (USB) interface circuit, a Multi Media Card (MMC) interface circuit, a Compact Flash (CF) interface circuit, a Memory Stick (MS) interface circuit, a PCI-Express interface circuit, an Integrated Drive Electronics (IDE) interface circuit, a Serial Advanced Technology Attachment (SATA) interface circuit, an external SATA Interface Circuit, or a Radio Frequency Identification (RFID) interface circuit.

11. A flash-memory controller comprising:

multi-level-cell (MLC) flash memory means for storing multiple bits of data per physical flash-memory cell, arranged as blocks of multiple pages, wherein pages are written and blocks are erased, wherein individual pages are not individually erasable except by erasing all pages in a block;

volatile logical-physical mapping table means for storing mapping entries, wherein a mapping entry stores a logical address of data from a host and a physical block address (PBA) indicating a location of the data within the MLC flash memory means and a page number of a page within the physical block;

volatile usage table means for storing valid bits for pages in the MLC flash memory means, wherein a valid bit for a page in the MLC flash memory means indicates a valid state when the page contains valid data, a stale state when the page contains data that has been replaced by newer data stored in a different page in the MLC flash memory means, and an erased state when the page has been erased and not yet written with data from the host;

physical sequential address counter means for generating physical block addresses in a high-low plane-interleaved sequence wherein a low interleave bit is toggled twice as frequently as a high interleave bit, wherein the PBA is formed from the high interleave bit, middle bits, and the low interleave bit, wherein the high interleave bit has a higher significance than the middle bits, and the middle bits have higher significance than the low interleave bit in the PBA;

middle increment means for incrementing the middle bits only when all pages in a block have been written;

low plane increment means for incrementing the low interleave bit for each new page of data written to the MLC flash memory means;

high plane increment means for incrementing the high interleave bit for every second new page of data written to the MLC flash memory means; and plane-interleaved access means for accessing the MLC flash memory means arranged as a first plane, a second plane, a third plane, and a fourth plane in a plane-interleaved order, using the high interleave bit and the low interleave bit to select from among the first, second, third, and fourth planes, whereby flash memory is accessed in a high-low plane-interleaved order of physical blocks.

12. The flash-memory controller of claim 11 wherein the middle bits comprise 11 bits, wherein the high-low plane-interleaved sequence is a 0, 1, 4096, 4097, 2, 3, 4098, 4099, 4, 5, 4100, 4101, . . . sequence of physical block addresses and the MLC flash memory means is accessed in a repeating loop of the first plane, the second plane, the third plane, and the fourth plane.

13. The flash-memory controller of claim 11 further comprising:

page counter means for incrementing the page number when all four planes have been accessed and all pages in the block have not been written.

14. The flash-memory controller of claim 11 wherein the volatile logical-physical mapping table means further comprises:

a plurality of sector table means, each for storing mapping entries having a same logical sector offset within logical blocks identified by the logical address.

15. The flash-memory controller of claim 14 wherein the volatile logical-physical mapping table means further comprises:

logical table means for storing logical valid bits that indicate valid logical sectors for each logical block having data stored in the MLC flash memory means;

wherein a sector table means in the plurality of sector table means is for storing a valid mapping entry when the logical valid bit corresponding to the same logical sector offset for the sector table means indicates that the data is stored in the MLC flash memory means.

\* \* \* \* \*